United States Patent [19]

Whikehart

[11] Patent Number: 4,592,074

[45] Date of Patent: May 27, 1986

[54] SIMPLIFIED HARDWARE IMPLEMENTATION OF A DIGITAL IF TRANSLATOR

[75] Inventor: J. William Whikehart, Cedar Rapids, Iowa

[73] Assignee: Rockwell International Corporation, El Segundo, Calif.

[21] Appl. No.: 616,361

[22] Filed: Jun. 1, 1984

[51] Int. Cl.$^4$ .............................................. H03D 9/00
[52] U.S. Cl. ..................................... 375/75; 455/323; 455/333; 364/725; 329/50; 375/77
[58] Field of Search ................... 307/260, 271, 272 R; 323/213, 217; 329/50, 101, 102; 364/725, 754; 370/20; 375/75, 77; 455/313, 323, 333, 314

[56]  References Cited

U.S. PATENT DOCUMENTS

| | | | |
|---|---|---|---|
| 2,965,849 | 12/1960 | Matthews et al. | 455/337 |
| 3,384,828 | 5/1968 | Pierre et al. | 323/213 |
| 3,634,773 | 1/1972 | Kobayashi | 329/50 |
| 3,908,114 | 9/1975 | White | 364/725 |
| 4,130,806 | 12/1978 | Van Gerwen et al. | 375/94 |
| 4,393,352 | 7/1983 | Volpe et al. | 329/101 |

Primary Examiner—Benedict V. Safourek
Attorney, Agent, or Firm—George A. Montanye; H. Fredrick Hamann

[57]  ABSTRACT

There is disclosed an implementation of a digital intermediate frequency (IF) translator which accepts a digital converted IF input and performs a complex mix to produce an IF baseband output in I (in-phase) and Q (quadrature phase) format. The translator reduces the sampling rate and provides filtering to produce I and Q components which can be subsequently utilized to derive the information contained in the original analog input signal. The translator is implemented with a configuration which simplifies the complex mix required to produce I and Q components and accumulates the samples to provide boxcar filtering prior to providing the I and Q components as outputs at a reduced sampling rate.

5 Claims, 3 Drawing Figures

SIMPLIFIED HARDWARE IMPLEMENTATION OF A DIGITAL IF TRANSLATOR

BACKGROUND OF THE INVENTION

The present invention relates to information processing systems, and more particularly, to translating circuits in digitally implemented receiving systems.

In recent years, there has been a trend in communication systems to implement a variety of the functions performed previously by analog circuits in an alternative digital configuration. This trend has been enforced by the rapid changes in solid state and digital processing technology as well as the advanced and improvements in software and microprocessor improvements which facilitate digital processing. Such advances and improvements have led to the greater use of converted analog signals into a digital format in order to improve the accuracies and quality of signal processing. There has therefore been a need for improved techniques and circuits for implementing the various digital conversions and functions that may be necessary in processing information in a digitally-implemented receiving system.

By way of example, in digitally implementing any analog receiving system, an analog signal is typically converted by an A/D converter and thereafter sampled at a given sampling rate to obtain the digital signal. The digital signal is then frequency translated by mixing to change the IF input to a lower IF baseband for further signal processing. The purpose of such frequency translation is to provide a lower IF frequency which facilitates implementation of the subsequent digital processing circuitry necessary to extract the information from the incoming IF signal. Thus, while high sampling rates may be necessary in converting and sampling the incoming analog signal in order to achieve a fairly accurate representation of the analog signal in digital form, high sampling rates tend to increase the complexity, cost and size of the digital circuitry necessary to process the converted information for subsequent use by the receiver. Accordingly, although the mathematics of frequency translation from IF to baseband may be relatively simple in theory, the actual implementation to achieve low cost circuits in a relatively non-complex manner has often been difficult. There is therefore a continuing need for systems designed to digitally implement frequency translating signal processing techniques in a digital environment to thereby enable the production of more reliable and low cost receivers.

The present invention has therefore been developed to overcome the specific shortcomings of the above known and similar techniques and to provide a digital IF translator of simplified construction for use in digitally implemented receivers.

SUMMARY OF THE INVENTION

In accordance with the present invention, a digital IF translator is constructed using minimal logic circuitry to sample and translate the IF frequency to baseband by production of filtered in-phase (I) and quadrature phase (Q) components. A received analog signal which has been converted by an A/D converter is sampled at a predetermined sampling rate to provide a sampled output. This sampled output is then coupled to provide a complex mix for producing I and Q components which are boxcar filtered to produce I and Q components at a lesser sampling rate at baseband for further processing. The circuitry is designed to produce the sequences necessary for enabling the complex mix and accumulation necessary for the ultimate output of the I and Q signals.

It is therefore a feature of the invention to provide an improved digital IF translating circuit for use in digitally implemented information processing systems.

It is a further feature of the invention to provide a specific implementation of a digital IF translator which reduces the circuitry necessary to perform a complex mix and boxcar filtering in order to translate an IF input signal to an IF baseband.

Still another feature of the invention is to provide an IF translator for digitally implemented receiving systems which reduces the sampling rate and provides filtering of the IF signal for digital processing.

These and other objects, advantages and novel features of the invention will become apparent from the following detailed description when considered with the accompanying drawings wherein:

DETAILED DESCRIPTION OF A PREFERRED EMBODIMENT

Figure 1:
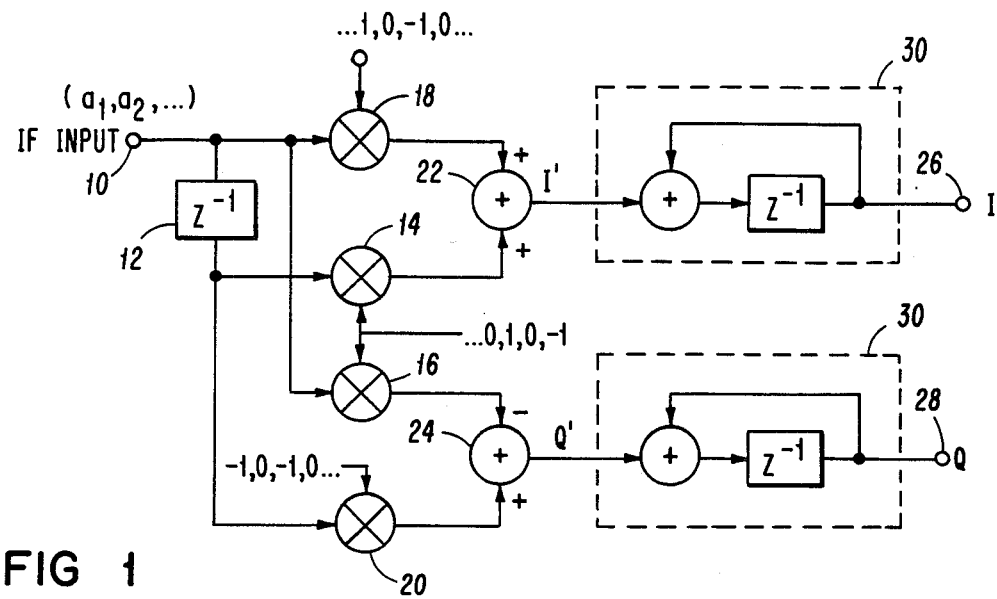
FIG. 1 is a block diagram showing the general mathematical representation of the frequency translation for converting an IF input to a baseband signal represented by the I and Q components.

Referring now to the drawings, wherein like elements and signals are referenced by like numerals throughout, there is shown a generic mathematical model of the IF translation which is implemented in accordance with the present invention. Specifically, in digital signal processing, it is generally desirable to convert the analog IF signal to I and Q baseband signals in order to minimize the processing rate required for IF filtering. By performing this mixing digitally, a nearly exact 90° relationship can be established with perfect amplitude balance. Also, if the IF and mixing frequency are one-quarter of the sampling rate, then the sine and cosine injection sequence necessary to obtain digitally the I and Q components of the IF baseband will simply be 1, 0, −1, 0 . . . for the cosine injection sequence, and 0, 1, 0, −1 . . . for the sine injection sequence.

As will be appreciated, if the IF input is represented by an input sequence ($a_1, a_2, \ldots$), then in order to obtain the IF translation, the input sequence must first be phase shifted 90° to obtain I and Q components and then down-converted by a complex mix using the sine and cosine injection. In FIG. 1, the input IF signal at terminal 10 represents an analog signal which has been converted by an analog-to-digital converter, and in the present example may be a 7 bit signal input from an A/D converter. This signal is phase shifted by a Hilbert transformer 12 and mixed by injecting the sine sequence at mixers 14 and 16 and injecting the cosine sequence at mixers 18 and 20. The outputs from the mixers 14 and 18 are added through adder 22 to produce an I' component which is coupled through a conventional boxcar filter to produce the I signal output for the IF baseband. Likewise, the outputs from mixers 16 and 20 are coupled through adder 24 so that the output from mixer 16 is subtracted from mixer 20 to produce the Q' component which is subsequently boxcar filtered to produce the Q channel output at 28. The boxcar filters are represented by an adder and storage register forming the circuits 30 depicted at each of the outputs of the adders 22 and 24.

In accordance with the above, the input sequences for the I' component would be:

$$I' = a_0, a_0, -a_2, -a_2, a_4, a_4, \ldots +a_{248}, +a_{248}$$

and the Q' sequence would be:

$$Q' = a_{-1}, -a_1, -a_1, a_3, a_3, \ldots a_{247}, a_{247}, -a_{249}, -a_{249}, \ldots$$

If the boxcar filters are constructed to accumulate a predetermined number of samples (250) of the respective I' and Q' sequences at the given sampling frequency to produce an output of I and Q, wherein I and Q equal the sum of that number of samples for the respectively summed I' and Q' samples, then the accumulation frames (number of samples summed) for I' and Q' can be designated as follows:

$$I' = \left| \underset{\text{Frame n}}{a_0, a_0, -a_2, -a_2 \ldots a_{248}, a_{248}} \;\middle|\; \underset{\text{Frame n+1}}{-a_{250}, -a_{250}, a_{252}, a_{250} \ldots -a_{498}, -a_{498}} \right|$$

and $$Q' = \left| \underset{\text{Frame n}}{a_{-1}, -a_1, -a_1, a_3, a_3 \ldots a_{247}, a_{247}, -a_{249}} \;\middle|\; \underset{\text{Frame n+1}}{-a_{249} \, a_{251}, a_{251} \ldots -a_{497}, -a_{497}, a_{499}} \right|$$

With the above, the I' and Q' sequences can be simplified such that:

$$I' = \left| \underset{\text{Frame n}}{2a_0, -2a_2 \ldots 2a_{248}} \;\middle|\; \underset{\text{Frame n+1}}{-2a_{250}, 2a_{252} \ldots -2a_{498}} \right|$$

and $$Q' = \left| \underset{\text{Frame n}}{a_{-1}, -2a_1, 2a_3 \ldots 2a_{247}, -a_{249}} \;\middle|\; \underset{\text{Frame n+1}}{-a_{249} \, 2a_{251} \ldots -2a_{497}, a_{499}} \right|$$

It will be appreciated from the above that all samples in the I' frames and all except the the end samples in the Q' frames can be multiplied by two and added at one-half the original accumulation rate (one-half of the original sampling rate in the present instance) to obtain the additions necessary to produce the I and Q signals. The end samples in the Q' frames must be added together, however, so that the Q' sequence then appears as follows:

$$Q' = \left| \underset{\text{Frame n}}{-2a_1, 2a_3 \ldots 2a_{247} \, (a_{-1} - a_{249})} \;\middle|\; \underset{\text{Frame n+1}}{2a_{251} \ldots -2a_{497}, (-a_{249} + 2_{499})} \right|$$

While the mathematic representation of FIG. 1 could be implemented in a variety of ways, the straight implementation with correponding circuitry would be too costly, time consuming, and complex for any practical implementation. Accordingly, without a simplification to allow the mathematical mixing and filtering to occur, the IF translation cannot be accomplished in any manner acceptable for use in comercial information processing environments. Accordingly, the present technique of FIG. 2 has been devised to implement the mathematical theory underlying the IF translation in such a manner that the cost and complexity of circuit implementation can be achieved.

Figure 2:
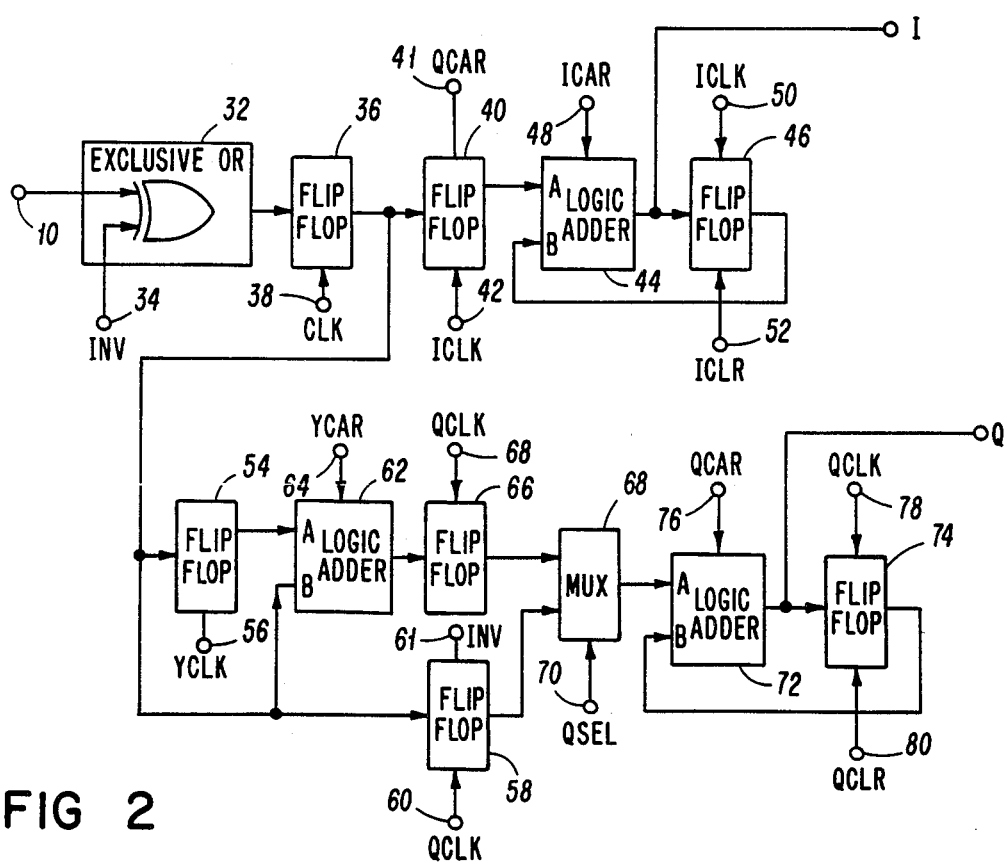
FIG. 2 is a schematic diagram showing the specific logic implementation in accordance with the present invention.
Figure 3:
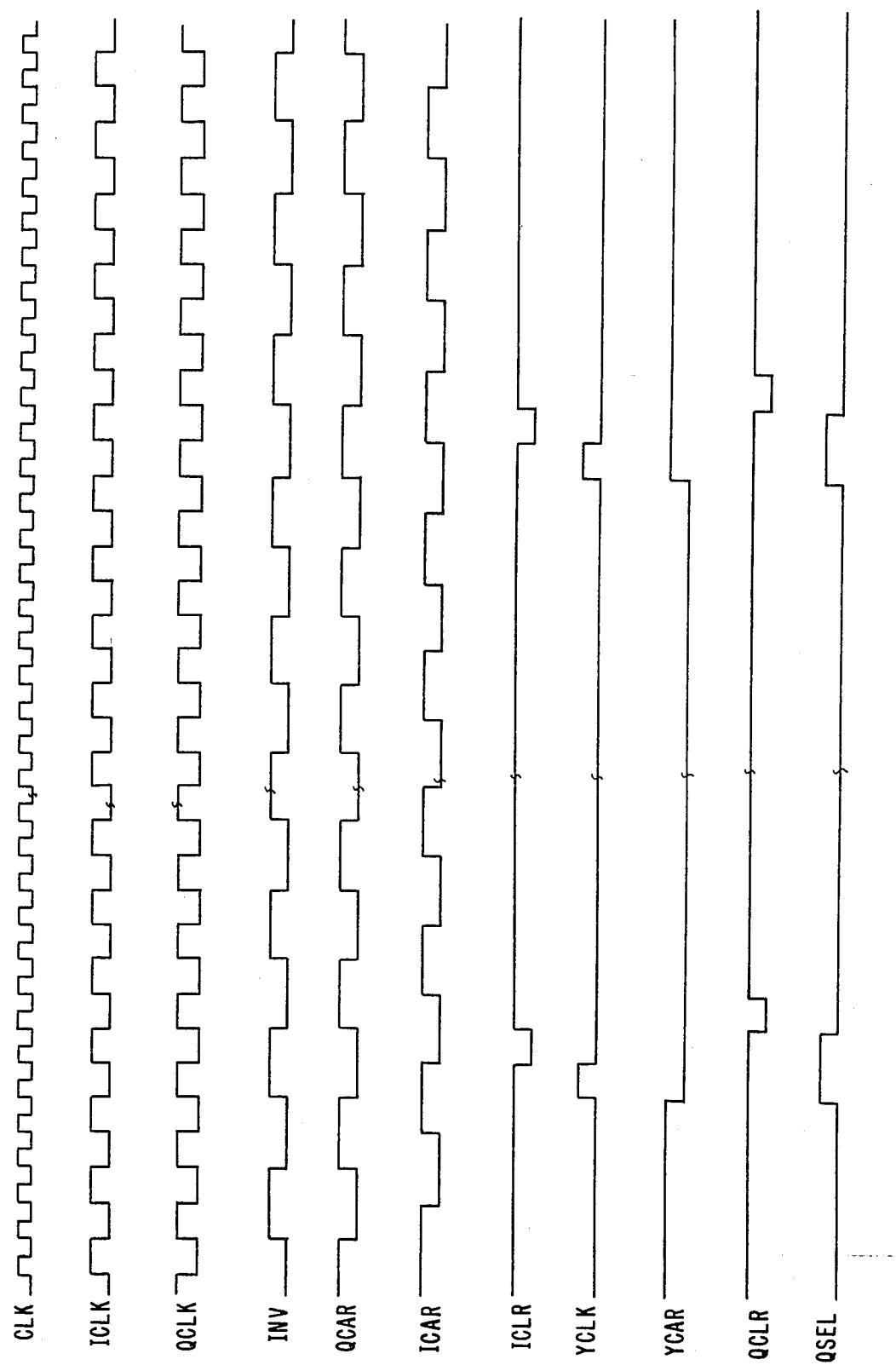
FIG. 3 is a timing diagram showing examples of the relationship between the various timing inputs with respect to an exemplary sampling rate of a specific system.

Referring now to FIG. 2, there is shown a circuit which is capable of implementing the IF translation necessary to reduce an IF signal to baseband by producing the I and Q baseband signals. The circuit produces the I and Q sequences at the input sampling frequency by a complex mix following a Hilbert transform and thereafter accumulates a predetermined number of samples at one-half of the sampling frequency to thereby reduce the sampling rate and provide the boxcar filtering necessary for a more efficient digital processing and implementation. Specifically, the present embodiment of FIG. 2 will be described with respect to a sampling rate of 12 MHz and the use of a seven bit digital word from an A/D converter representing the analog IF frequency input to a receiving system. It will be recognized, however, that other sampling frequencies are possible as long as the timing relationships as exemplified by the circuit of FIG. 2 and timing diagram of FIG. 3 are maintained for those same sampling frequencies. It should also be understood that while single flip-flops are shown in FIG. 2, each is intended to represent a plurality of conventionally coupled flip-flops of such number as is necessary to accommodate the bit length of the digital samples.

In accordance with the present invention, the input IF once converted to digital form is provided to the input terminal 10 of FIG. 2 as one input to an exclusive-OR gate 32 having a second input 34 acting as an inverting signal INV for every other two inputs provided at input 10. In the present example, the input at 34 is a 3

MHz signal at one quarter of the 12 MHz sampling frequency. The output from the exclusive-OR gate 32 is provided to a flip-flop 36 which is clocked at the sampling frequency of 12 MHz at terminal 38 by the CLK signal. The output from this flip-flop is coupled as an input to flip-flop 40 which is clocked at clock terminal 42 by a signal designated as ICLK and receives a QCAR signal at terminal 41. The output from 40 is coupled to input A of a conventional logic adder 44. The output from 44 is coupled as input to flip-flop 46 which has its output coupled to input B of adder 44. Adder 44 and flip-flop 46 thus act as an accumulator which provides the I component of the baseband IF signal at the output of 44. The terminal 48 of adder 44 is the conventional carry input of adder 44 and is driven by an ICAR signal while the flip-flop 46 is clocked by an ICLK signal at terminal 50 and cleared by an ICLR signal at terminal 52.

The output from flip-flop 36 is also coupled as an input to flip-flop 54 having a clock terminal 56 clocked by the YCLK signal. The same output from 36 is coupled as input to flip-flop 58 having a clock input clocked by the QCLK signal at terminal 60 and an INV signal applied to terminal 61. That same output from 36 is coupled as an input along with the output from flip-flop 54 to a conventional logic adder circuit 62 having inputs A and B. Adder 62 ha its carry input driven by a YCAR signal while its output is coupled to flip-flop 66 having its clock terminal 68 clocked by the QCLK signal. The outputs from flip-flops 66 and 58 are in turn coupled to a conventional multiplexer whose inputs are selected by the QSEL signal at conventional select terminal 70.

The output from multiplexer 68 is coupled to a circut identical to that formed by elements 44 and 46 of the I channel. In particular, adder 72 and flip-flop 74 are coupled so that the output of flip-flop 74 and the output of multiplexer 68 form the inputs A and B to adder 72 whose carry input is driven by the QCAR signal at terminal 76. The output from adder 72 forms the Q channel output and the flip-flop 74 is clocked by the QCLK signal at terminal 78 and cleared by the QCLR signal at terminal 80. The outputs from adders 44 and 72 thus form the I and Q components of the baseband IF signal to be delivered for further signal processing.

With respect to each of the elements shown in the Figures, the same are constructed from conventional logic elements coupled in a conventional manner to perform the identified functions. Specifically, the multiplexer 68 is a conventional multiplexer whose inputs are selected for output by logic signal QSEL to provide the transfer of the adder value for the Q channel in a manner as will be described below. The adders 44, 62 and 72 are likewise full logic adders coupled in a conventional manner with carry inputs receiving the ICAR, YCAR and QCAR signal, respectively, to produce the necessary sequence addition to obtain the I and Q components.

Referring again to FIG. 2 and the referenced sequences resulting in the I' and Q' frames, it will be seen that for each of the samples in the I' frame, the same can be multiplied by two and added at one-half of the accumulation rate to therefore reduce the sampling rate to obtain the I component. This is accomplished by clocking the flip-flop 46 at 6 MHz when using a 12 MHz clock frequency to therefore produce the sum of the sequences to produce the I signal output at baseband. This same addition can be accomplished by the Q channel adder 72 and flip-flop 74. However, it will be recognized that in the Q' sequence, the end samples in the Q' frames must be added together in order to arrive at the proper Q' sequence. Accordingly, flip-flop 54 is coupled to receive the output at flip-flop 36 representing the Q channel sequence so that the first sample of that sequence is stored in flip-flop 54. The output from 54 is then coupled to adder 62 whose carry input is driven by the YCAR signal so that the last sample of the Q sequence from flip-flop 36 is summed with the first sample in adder 62 and provided at the output of flip-flop 66. In this manner, the first and last samples are added by adder 62 and multiplexed at the appropriate point through multiplexer 68 to perform the addition in the boxcar circuits formed by the adder 72 and flip-flop 74. This thus produces the Q signal of the IF baseband by performing the appropriate additions for the frames of Q' sequence.

In order to obtain the proper multiplication by two as previously referenced, the samples received by flip-flops 40 and 58 are shifted up by coupling the least significant bit (LSB) of the input from the previous element 36, one bit position up from the normal LSB input of the flip-flops 40 and 58. The outputs from 40 and 58 are then coupled in a normal manner to the adder input A of adders 44 or 72. This will cause the input to the adders 44 and 72 to be effectively multiplied by two as required. The QCAR signal is then provided to the unused LSB position at terminal 41 of the flip-flop 40 so that in cooperation with the ICAR signal of adder 44, a 2 is added to the sum. Likewise, the INV signal is coupled to the unused LSB position at terminal 61 of flip-flop 58 so that in cooperation with the QCAR signal of adder 72, a 2 is added to the sum.

In accordance with the present example, the present circuitry is implemented using seven bit data from an A/D converter which is in the form of a two's complement digital number. As a result, the relationship $-A = \overline{A} + 1$ can be used in connection with a digital number A. In the implementation of the circuit, the data from the exclusive-OR is clocked through flip-flop 36 at the 12 MHz clock frequency and the I' and Q' sequences picked off by flip-flops 40 and 58, respectively, which are clocked by the ICLK and QCLK signals at 6 MHz. The output for the I channel from flip-flop 40 is coupled to the accumulator formed by adder 44 and flip-flop 46, while the output for the Q channel from flip-flop 58 is coupled to the accumulator formed by adder 72 and flip-flop 74. In this manner, the 250 samples of each frame for the I and Q sequences are added by the accumulation of 125 samples for each sequence.

While the above operation is straightforward in the I channel, the Q channel requires an addition of the first and last samples of those 250 samples for a Q frame. Accordingly, flip-flop 54 clocks once per frame to store the first end sample until the end of the frame. At that point, adder 62 adds the first and last sample and the YCAR signal adds a plus-one to make the digital signal A into a $-A$. The resultant output from adder 62 is clocked by the 6 MHz QCLK signal to flip-flop 66 and provides its output to the multiplexer 68. For the first 124 additions of the Q channel accumulator, the multiplexer 68 selects the output of flip-flop 58 at the input for the Q sequence addition. For the 125th or last addition, the multiplexer 68 selects the output of the flip-flop 66 which represents the addition of the first and last samples of the Q sequence. The accumulator formed by adder 72 and flip-flop 74 thus accumulates 125 samples in the Q channel in accordance with the proper input sequence. The resulting I and Q channel outputs are then baseband IF signals in a digital format which have been reduced to a sampling rate of one-half of that originally used to sample the digital signal representing the analog IF input.

Referring to FIG. 3, there is shown a general timing diagram in accordance with the present invention. Specifically, each of the signals designated by the individual waveforms is a typical squarewave and correspond in phase and frequency with one another in the manner indicated in the drawing. Thus, the 6 MHz ICLK and QCLK signals are at one-half of the CLK frequency of 12 MHz but phase-shifted by 180° with respect to one another. Likewise, the INV signal is a 3 MHz signal having a phase relationship with respect to the ICLK and QCLK signals as shown. The QCAR signal is a 3 MHz signal having 180° phase shift from the INV signal. The ICAR signal is a 3 MHz signal phase-shifted by 90° from the QCAR signal. The ICLR and QCLR signals each occur once a frame and serve to reset the output of the accumulators following the addition of all of the samples in a frame. The YCLK signal also occurs once a frame to produce a sampling of the first sample in a Q sequence. The YCAR signal is a squarewave which causes the change of a digital number A in adder 62 to −A in accordance with the previous description.

As will be appreciated from the timing sequence of FIG. 3, the ICLK and QCLK signals provide the 125 samples per I and Q channel for each 250 sample frame. The ICAR and QCAR signals are squarewave signals which act to change the signs in the sequence addition to cause the appropriate resultant I. and Q channel outputs. The YCAR signal prevents a loss of any information in the addition needed to provide the mathematical output of the I and Q channel. Likewise, the QSEL signal is required to multiplex the last addition of the Q sequence from flip-flop 66 while the ICLR and QCLR are signals necessary to clear the accumulation after each frame representing the I and Q signals so that an accumulation for the next frame can begin.

As has been previously stated, the particular logic circuits of the present configuration of FIG. 2 can be implemented with conventional elements. By way of example, the exclusive-OR gate 32 could be formed using S86's, the flip-flop 36 formed using S174's, the adders formed using LS 283's, and the multiplexer 68 formed using LS374's. The identified flip-flops are D flip-flops wherein the input is provided at the D input of the flip-flop and the output taken from the Q output of that flip-flop. It will be apparent that other particular integrated circuits could be used in lieu of those identifed above to accomplish the same functions described herein. It should also be appreciated that while one flip-flop is shown, the actual circuit implementation will be made with a plurality of flip-flops coupled to handle the bit width of the digital samples in a conventional fashion.

In accordance with the present invention, the IF translation and boxcar filtering can be achieved with simple logic structures which reduce the complexity and cost of a digital information processing system while improving its reliability. The simple system can be implemented with conventional integrated circuit techniques to produce the appropriate sequence outputs necessary to perform the mathematical phase shifting and mixing to achieve the I and Q channel signals at baseband. The particular structure allows the mathematics of frequency translation to be implemented which would otherwise be of complex and costly configuration if implemented directly in the mathematical format. These are all features which are not shown or suggested by the prior art.

Obviously, many other modifications and variations of the invention are possible in light of the above teachings. It is therefore to be understood that within the scope of the appended claims, the invention may be practiced otherwise than as specifically described.

What is claimed is:

1. A digital translator comprising:
    means for sampling a digital input signal sequence representing a digital intermediate frequency at a sampling rate;
    means for selecting samples of said input sequence to form a first channel sample sequence and a second channel sample sequence;
    first means for summing a predetermined number of samples of said first channel sample sequence to provide an in-phase channel output of said digital input signal;
    second means for summing the first and last samples of a predetermined number of said second channel sample sequence to provide a sum output; and
    third means for summing a predetermined number of samples of said second sample sequence with said sum output to provide a quadrature phase channel output of said digital input signal.

2. The system of claim 1 wherein said first and third means for summing is an accumulator which is coupled to add successive samples of said sample sequence to the sum of previous samples of said sample sequence over a predetermined frame interval.

3. The system of claim 2 further including means for clearing said accumulator at the beginning of each frame interval.

4. The system of claim 2 wherein said first and third means for summing is constructed and arranged to accumulate at a rate less than the sampling rate of said means for sampling.

5. In a communications system having means for receiving a communications signal, means for converting that communications signal into an intermediate frequency, and means for translating said intermediate frequency to a lower intermediate frequency prior to signal processing, the improvement in said means for translating comprising:
    means for sampling a digital input signal sequence representing a digital intermediate frequency at a sampling rate;
    means for selecting samples of said input sequence to form a first channel sample sequence and a second channel sample sequence;
    first means for summing a predetermined number of samples of said first channel sample sequence to provide an in-phase channel output of said digital input signal;
    second means for summing the first and last samples of a predetermined number of said second channel sample sequence to provide a sum output; and
    third means for summing a predetermined number of samples of said second sample sequence with said sum output to provide a quadrature phase channel output of said digital input signal.

* * * * *